(12) United States Patent
Martin et al.

(10) Patent No.: US 10,931,192 B2
(45) Date of Patent: Feb. 23, 2021

(54) DISCRETE CAPACITOR STRUCTURE

(71) Applicant: TEXAS INSTRUMENTS INCORPORATED, Dallas, TX (US)

(72) Inventors: Alan Dean Martin, San Jose, CA (US); Marc Davis-Marsh, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/701,438

(22) Filed: Sep. 11, 2017

(65) Prior Publication Data

US 2018/0076707 A1    Mar. 15, 2018

Related U.S. Application Data

(60) Provisional application No. 62/385,936, filed on Sep. 9, 2016.

(51) Int. Cl.
| | |
|---|---|
| *H02M 3/06* | (2006.01) |
| *H02M 7/00* | (2006.01) |
| *H02M 1/44* | (2007.01) |
| *H03H 7/00* | (2006.01) |
| *H02H 9/00* | (2006.01) |
| *H01L 27/01* | (2006.01) |
| *H01G 2/06* | (2006.01) |

(52) U.S. Cl.
CPC ............ *H02M 3/06* (2013.01); *H01L 27/016* (2013.01); *H02H 9/001* (2013.01); *H02M 1/44* (2013.01); *H03H 7/004* (2013.01); *H01G 2/06* (2013.01)

(58) Field of Classification Search
CPC ......... H03H 7/0115; H03H 2001/0085; H03H 7/004; H02M 3/06; H02M 1/44

USPC .......................................... 333/175, 181, 185
See application file for complete search history.

(56) References Cited

U.S. PATENT DOCUMENTS

| | | | | |
|---|---|---|---|---|
| 3,201,719 A | * | 8/1965 | De Monte ................ | H04B 3/40 333/169 |
| 3,701,958 A | * | 10/1972 | Jaag ...................... | H03H 7/0161 333/185 |
| 2010/0321857 A1 | * | 12/2010 | Habu ...................... | H01G 7/06 361/281 |
| 2016/0013770 A1 | * | 1/2016 | Sato ........................ | H01G 7/06 333/185 |

(Continued)

*Primary Examiner* — Rakesh B Patel
(74) *Attorney, Agent, or Firm* — Michael A. Davis, Jr.; Charles A. Brill; Frank D. Cimino

(57) ABSTRACT

A discrete field coupled capacitor with a cross-connected capacitor-pair, such as for use as a discrete bypass capacitor. The FCC includes a first port with first and second terminals, and a second port with third and fourth terminals. A first capacitor structure is connected between the first and second terminals, and a second capacitor structure connected between the third and fourth terminals. A cross-connect structure includes a first cross-connection to connect the first terminal to the third terminal, and a second cross-connection to connect the second terminal to the fourth terminal, to cross-connect the first and second capacitor structures. The capacitor structures have respective parasitic ESL, and can be disposed in proximity to effect a pre-defined ESL field coupling with reverse phasing to reduce parasitic ESL. The FCC can be constructed as a PCB or monolithic device. In a PCB four-layer construction, the cross-connections can be formed on respective mid-layers.

15 Claims, 5 Drawing Sheets

(56) References Cited

U.S. PATENT DOCUMENTS

2017/0272047 A1\* 9/2017 Tanaka .................... H01P 1/203

\* cited by examiner

DISCRETE CAPACITOR STRUCTURE

CROSS-REFERENCE TO RELATED APPLICATIONS

Priority is claimed under 37 CFR 1.78 and 35 USC 119(e) to U.S. Provisional Application 62/385,936, filed 2016 Sep. 9), which is incorporated by reference.

BACKGROUND

Technical Field

This patent Disclosure relates to discrete passive components/devices, such as for use in printed circuit board assemblies (PCBA) for filtering EMI (electromagnetic interference), such as for use in PCBA switched mode power supplies.

Related Art

PCBA designs include electronics components (devices) and an interconnect structure (traces). Electronics components include integrated circuits and discrete components. Discrete components include discrete passives such as resistors, capacitors and inductors.

In an example application, a switched mode power supply (SMPS) will generate (propagate) both conducted and radiated EM fields. For conducted EMI, noise is coupled via conductors or through parasitic impedances, or power and ground connections. Conducted EMI arises from the normal operation of the SMPS switching electronics. For example, discontinuous currents are present at the input side of buck power converters, the output side of boost power converters, and at both input and output ports of flyback and buck-boost topologies. Voltage ripple generated by discontinuous currents can propagate as conducted EMI.

An SMPS PCBA can include EMI bypass filtering for both the input and output side to reduce high frequency conducted EMI generated by the switching electronics (such as an SMPS power converter IC). In the case of discrete bypass capacitor components, such as SMD (surface mount device) capacitors, the bypass effectiveness of the discrete capacitor can be reduced or negated at higher frequencies due to parasitic inductance from surface mounting and packaging. Such effective series inductance (ESL) causes a parasitic inductive impedance that increases with increasing frequency.

Small value discrete capacitors can be placed in parallel with larger ones in an effort to construct filter sections with a lower ESL to satisfy bypass requirements at higher frequencies. In addition, added series filter inductors can be required to meet performance or compliance specifications.

While this Background information references SMPS PCBA designs, this patent Disclosure is more generally directed to discrete capacitor structures.

BRIEF SUMMARY

This Brief Summary is provided as a general introduction to the Disclosure provided by the Detailed Description and Drawings, summarizing aspects and features of the Disclosure. It is not a complete overview of the Disclosure, and should not be interpreted as identifying key elements or features of, or otherwise characterizing or delimiting the scope of, the disclosed invention.

The Disclosure describes apparatus and methods for an example discrete field coupled capacitor with a cross-connected capacitor-pair structure, referred to as a Field Coupled Capacitor (FCC).

According to aspects of the Disclosure, a discrete field coupled capacitor with a cross-connected capacitor-pair, such as for use as a discrete bypass capacitor. The FCC includes a first port with first and second terminals, and a second port with third and fourth terminals. A first capacitor structure is connected between the first and second terminals, and a second capacitor structure connected between the third and fourth terminals. A cross-connect structure includes a first cross-connection to connect the first terminal to the third terminal, and a second cross-connection to connect the second terminal to the fourth terminal, to cross-connect the first and second capacitor structures. The capacitor structures have respective parasitic ESL, and can be disposed in proximity to effect a pre-defined ESL field coupling with reverse phasing to reduce parasitic ESL. The FCC can be constructed as a PCB or monolithic device. In a PCB four-layer construction, the cross-connections can be formed on respective mid-layers.

Other aspects and features of the invention claimed in this Patent Document will be apparent to those skilled in the art from the following Disclosure.

[531 in mid-layer 2, 532 in mid-layer 1], and with vias arranged in split landing pads [top layer vias 511/512/513/514, bottom layer vias 521/522/523/524].

Figure 6:
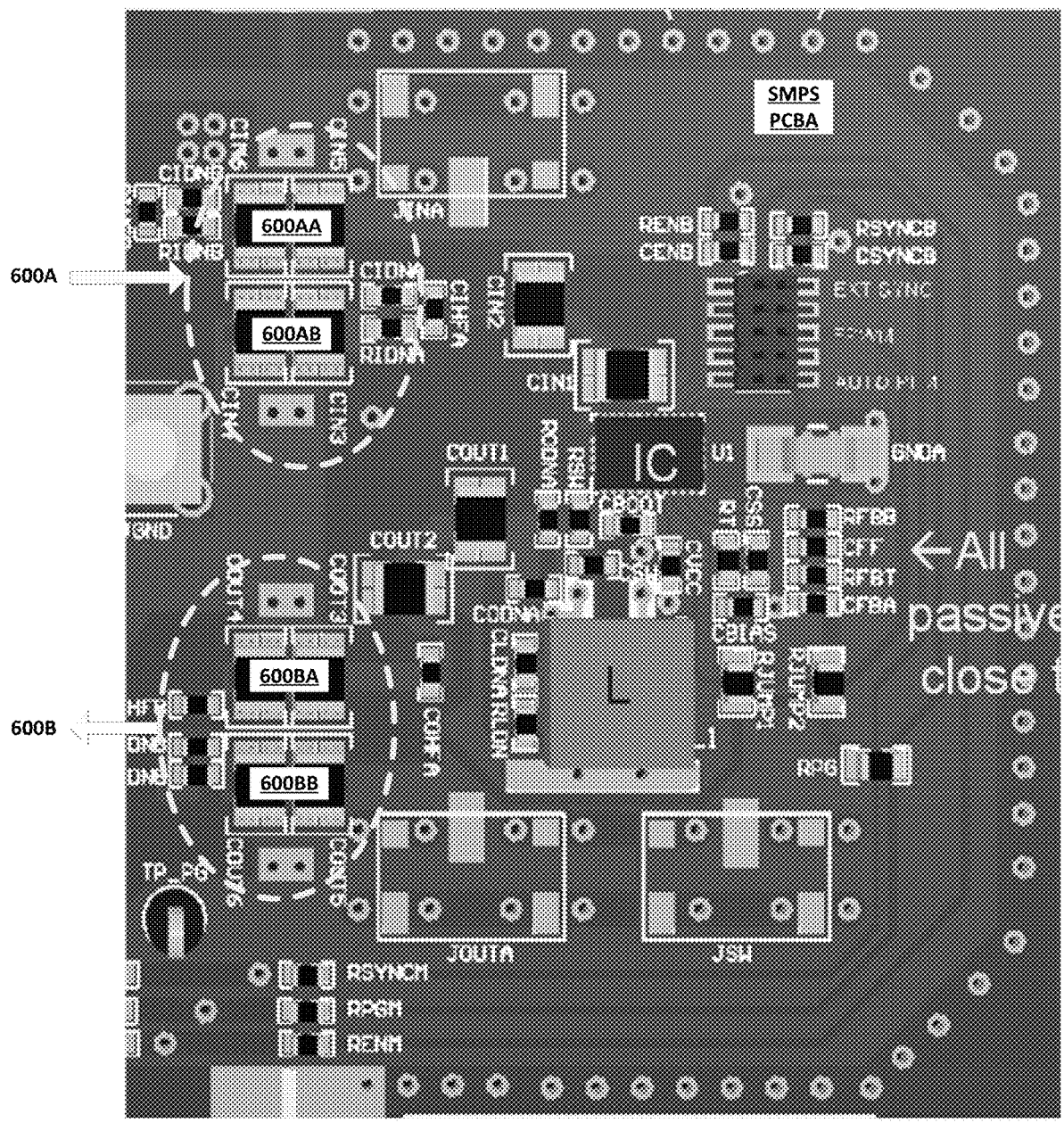

FIG. 6 illustrates a portion of an example PCBA for an example SMPS with a converter IC and inductor L, and including an input FCC filter section [600A] with an FCC double-set [600AA, 600A6], and an output FCC filter section [600B] with an FCC double-set [6006A, 600BB].

Figure 7A:
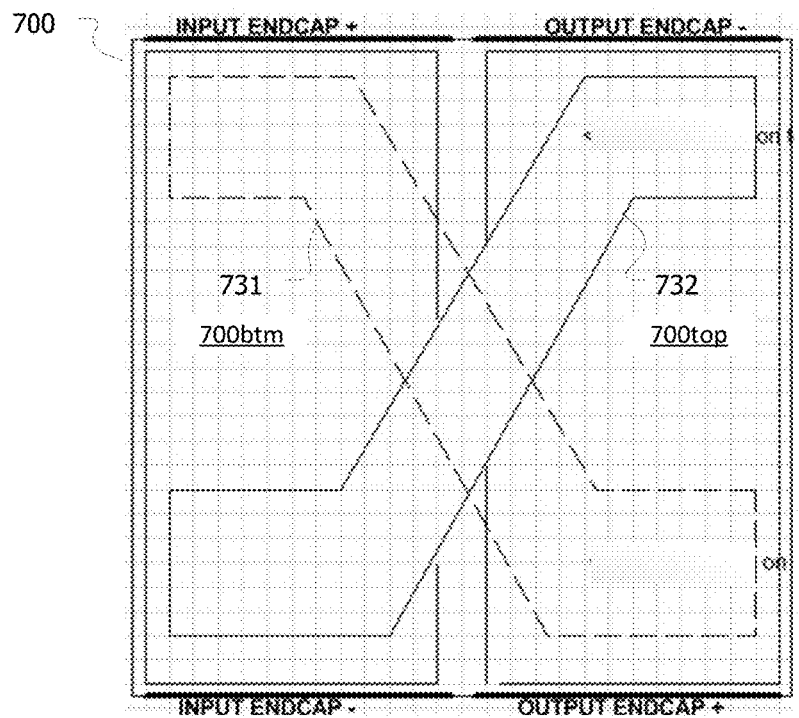
Figure 7B:
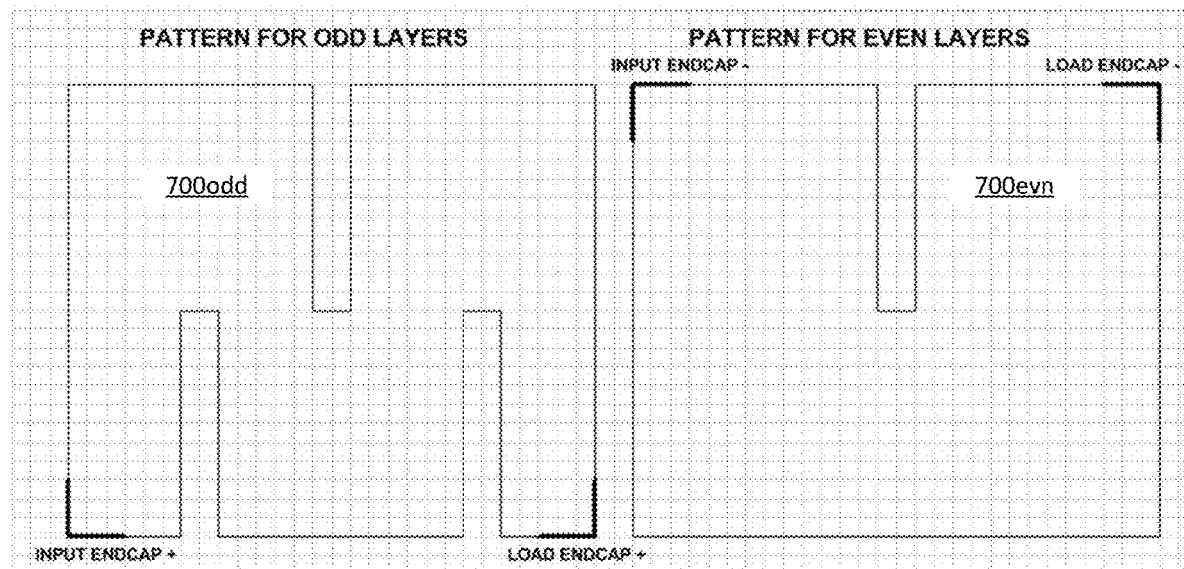

FIGS. 7A/76 illustrate an example monolithic implementation for an integrated Field Coupled Capacitor: FIG. 7A illustrating top and bottom layers [700top and 700bot]; and FIG. 7B illustrating respective patterns for odd/even mid-layers [700odd and 700evn], with the top/bottom layers [700top/700bot] including FCC cross-connect [732/731].

DETAILED DESCRIPTION

This Description and the Drawings constitute a Disclosure for a discrete field coupled capacitor with a cross-connected capacitor-pair structure, including describing design examples (example implementations), and illustrating various technical features and advantages.

Figure 1:
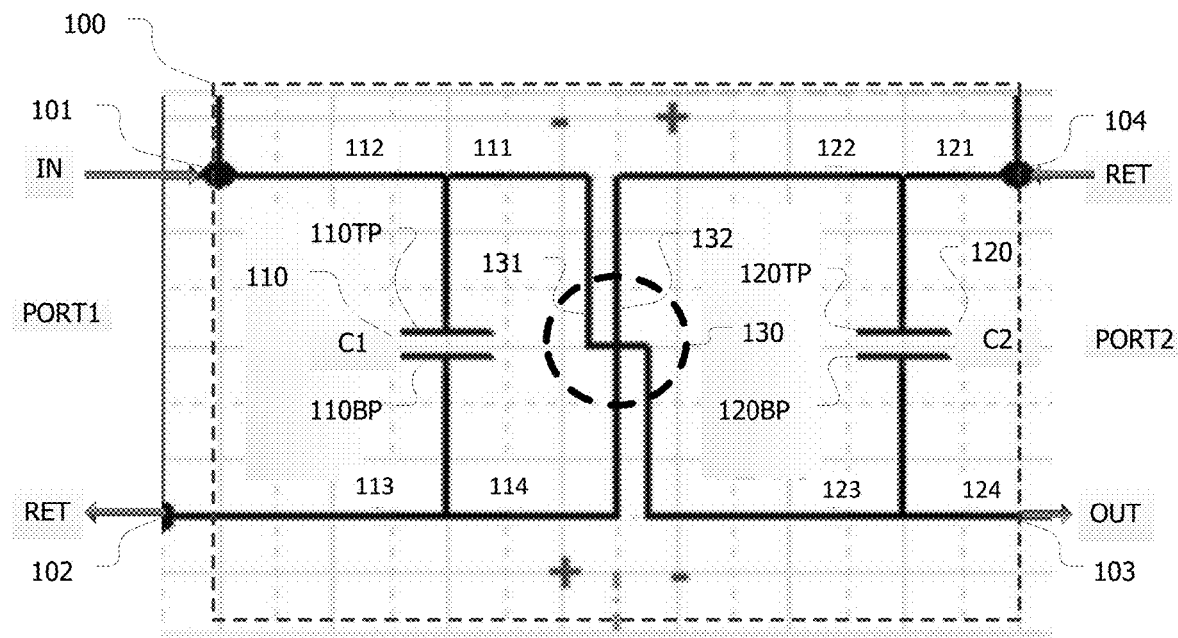
FIG. 1 illustrates an example discrete field coupled capacitor with a cross-connected capacitor-pair structure [100] according to this Disclosure, referred to as a Field Coupled Capacitor (FCC), with a capacitor-pair C1/C2 [110/120], cross-connected [130, 131/132] as a two-port four-terminal filter: Port 1 with IN/RET terminals [101/102], and Port 2 with OUT/RET terminals [103/104], including IN cross-connected to OUT, and the RET terminals cross-connected.
Figure 2:
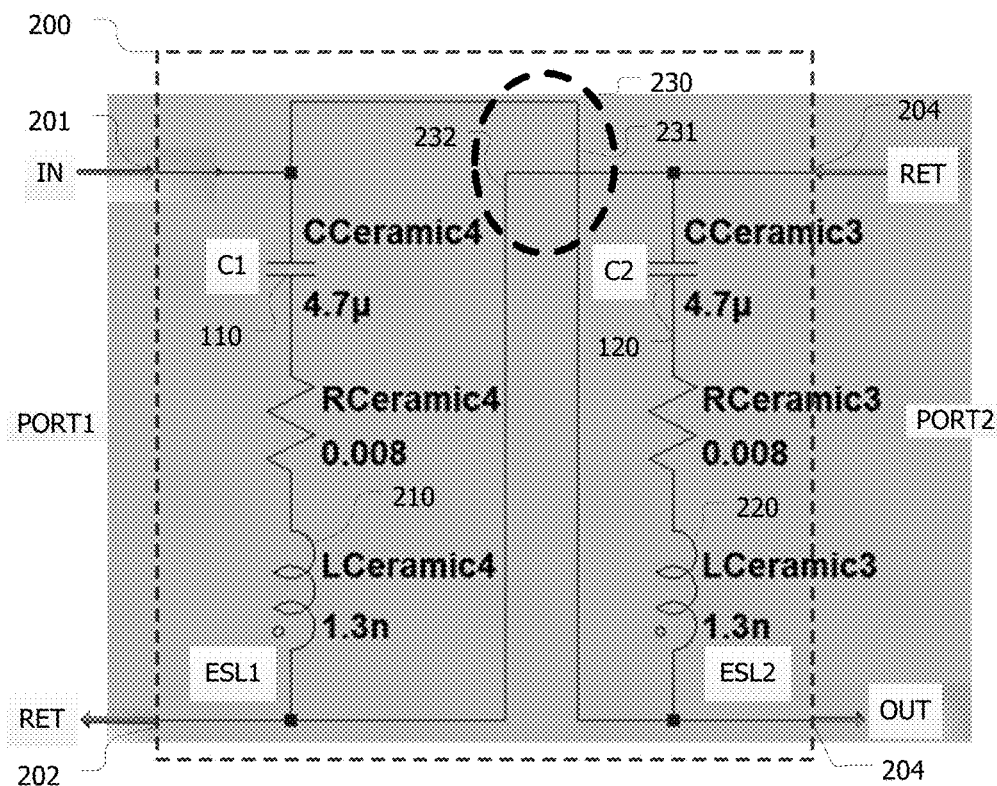
FIG. 2 illustrates an example equivalent circuit [200] for the example two-port, four-terminal Field Coupled Capacitor of FIG. 1, with terminals IN/OUT [201/203], and RET/RET [202/204], including a capacitor-pair C1/C2 [110/120] with parasitic effective series inductances ESL1/ESL2 [210/220], the capacitor-pair C1/C2 cross-connected [230, IN/OUT 231 and RET/RET 232] so that the parasitic inductances ESL1/ESL2 are coupled inverse parallel (out-of-phase) to effect field coupling.

Field Coupled Capacitor (FCC) is used in this Disclosure to refer to a discrete capacitor structure with a capacitor-pair arranged in proximity and cross-connected as a two-port four-terminal network (FIGS. 1-2). Cross-connection of proximate capacitor structures effects out-of-phase field coupling of parasitic ESL (effective series inductances) to reduce ESL impedance at frequencies of interest. FCC discretes can be implemented as a PCB (printed circuit board) layout (FIGS. 3-5), or as a monolithic integrated device (FIGS. 7A-7B).

Example applications for the Disclosed Field Coupled Capacitor include both switch mode and linear power applications, such as for bypass filtering. In the case of a switch mode regulator (FIG. 6), two FCC filter sections can be implemented: (a) an input-side FCC filter section can reduce conducted differential emissions, eliminating the need for additional input filtering, or enabling a smaller and lower cost design; (b) an output-side FCC filter section can reduce high frequency output ripple to reduce noise in the power distribution network, for example, improving jitter performance of an oscillator running off the power supply rail. In the case of a linear regulator, FCC filtering can increase the high frequency power supply rejection ratio. For example, for SMPS bypass filtering, frequency reductions in the range of 20 to 40 dB (10-100) can be achieved, and for linear regulators, PSRR (Power Supply Rejection Ratio) can be improved past 100 MHz.

In brief overview, a discrete field coupled capacitor with a cross-connected capacitor-pair, such as for use as a discrete bypass capacitor. The FCC includes a first port with first and second terminals, and a second port with third and fourth terminals. A first capacitor structure is connected between the first and second terminals, and a second capacitor structure connected between the third and fourth terminals. A cross-connect structure includes a first cross-connection to connect the first terminal to the third terminal, and a second cross-connection to connect the second terminal to the fourth terminal, to cross-connect the first and second capacitor structures. The capacitor structures have respective parasitic ESL, and can be disposed in proximity to effect a pre-defined ESL field coupling with reverse phasing to reduce parasitic ESL. The FCC can be constructed as a PCB or monolithic device. In a PCB four-layer construction, the cross-connections can be formed on respective mid-layers.

FIG. 1 illustrates an example discrete Field Coupled Capacitor structure 100, according to this Disclosure. FCC 100 includes a capacitor-pair C1 110 and C2 120: C1 includes a top/bottom plates 110TP/110BP, and C2 includes top/bottom plates 120TP/120BP.

FCC 100 includes a cross-connect 130 (131/132) that cross-connects C1/C2 110/120. That is, C1 top plate 110TP is cross-connected to C2 bottom plate 120BP, and C1 bottom plate 110BP is cross-connected to C2 top plate 120TP.

FCC 100 is structured as a two-port four-terminal network (passive): Port 1 with IN/RET terminals 101/102, and Port 2 with OUT/RET terminals 103/104. Capacitor C1 is connected between IN terminal 101 and RET terminal 102. Capacitor C2 is connected between OUT terminal 103 and RET terminal 104. C1 and C2 are cross-connected by cross-connect 130 (131/132). IN 101 is cross-connected to the OUT 103 by cross-connection 131, and the RET 102 is cross-connected to RET 104 by cross-connection 132.

In an example SMPS power conversion/distribution application, IN 102 can be coupled to a DC (positive) power source, through the cross-connect 131, to OUT 104, which can be coupled to provide DC power (positive) to a load. Return (negative) can be coupled from the load to RET 104, through the cross-connect 132, to RET 102.

FIG. 2 illustrates an example equivalent circuit 200 for the example two-port, four-terminal Field Coupled Capacitor structure of FIG. 1. Terminals IN/OUT 201/203, and RET/RET 202/204 are connected to a capacitor-pair C1/C2 110/120.

Parasitic inductance associated with the discrete capacitor-pair devices is represented by effective series inductances ESL1/ESL2 210/220. ESL parasitics can arise from routing/mounting and packaging. Example approximate equivalent circuit values are given for an example surface mount ceramic capacitor.

Cross-connect 230 (231/232) for the capacitor-pair C1/C2 results in the parasitic inductances ESL1/ESL2 being coupled inverse parallel to effect out-of-phase field coupling between the ESL inductances. The mutual coupling with reversed phasing of the ESL inductances effects field cancellation, reducing ESL parasitic impedance across a pre-defined frequency range. In effect, the cross-coupled ESL inductances behave as a shorted transformer winding, significantly reducing the ESL parasitic impedance within a specified frequency band.

Figure 3:
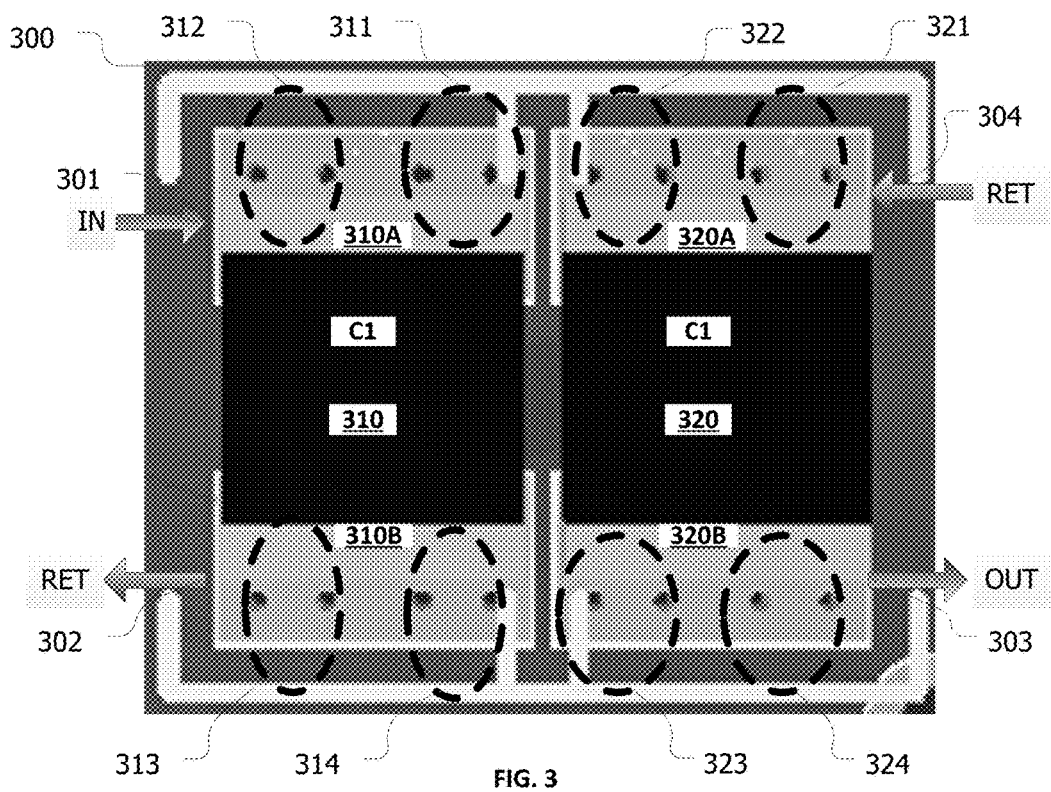
FIG. 3 illustrates an example surface-mount implementation of a four-terminal Field Coupled Capacitor [300, with terminals IN/RET 301/302, and terminals OUT/RET 303/304], with a capacitor-pair C1/C2 [310/320], constructed with respective end caps [310A/B, 320A/B], and including vias arranged in split landing pads [vias 311/312 in end cap 310A, vias 313/314 in end cap 310B, vias 321/322 in end cap 320A, vias 323/324 in endcap 320B].

FIG. 3 illustrates an example surface-mount implementation of a four-terminal Field Coupled Capacitor 300, with Port 1 terminals IN/RET 301/302, and Port 2 terminals OUT/RET 303/304. FCC 300 includes a capacitor-pair C1/C2 310/320.

Discrete capacitors C1/C2 310/320 are constructed with respective end caps 310A/B and 320A/B. Capacitor end caps 310A/B and 320A/B include multiple vias (physical contacts) arranged in split landing pads: vias 311/312 in end cap 310A, vias 313/314 in end cap 310B, vias 321/322 in end cap 320A, and vias 323/324 in endcap 320B.

Only two vias (physical contacts) are required to effect cross-connection of the capacitor-pair C1/C2. Additional vias can be used to reduce DC resistance. Using split vial landing pads can be used to facilitate trace routing.

Figure 4:
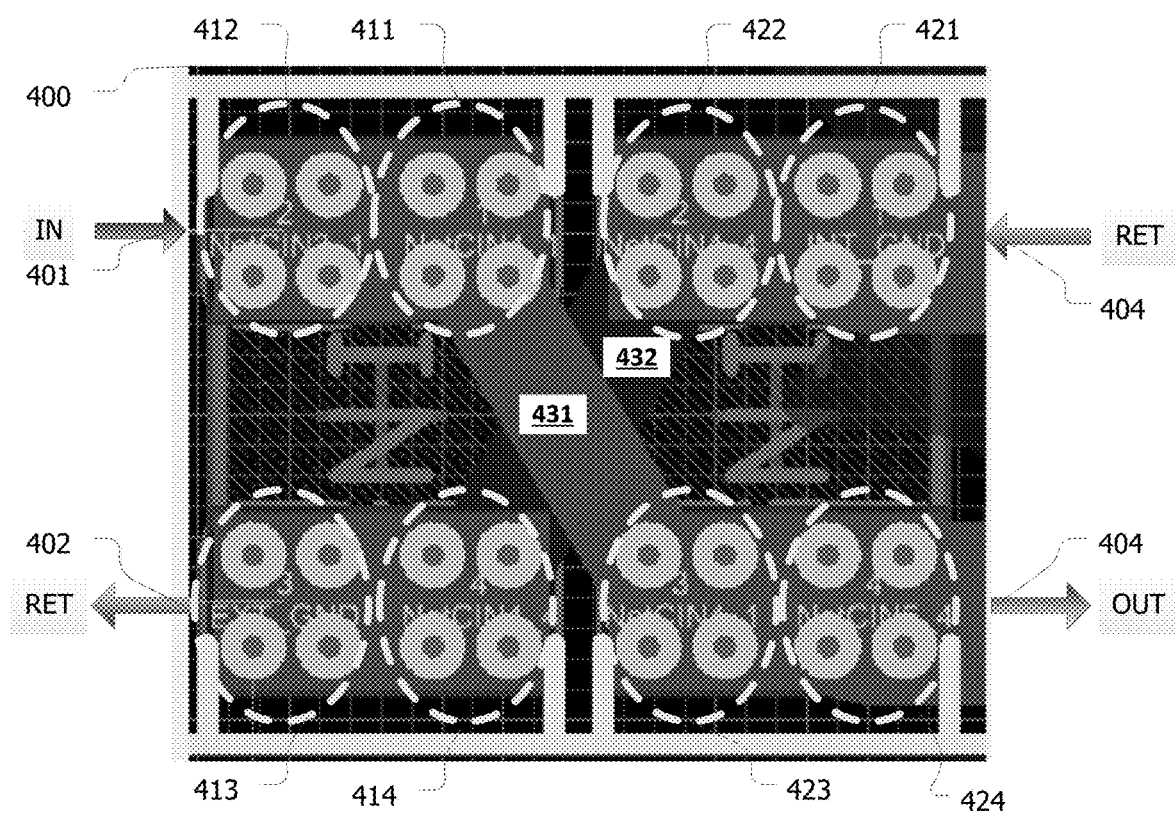
FIG. 4 illustrates an example two-layer PCB construction for an example four-terminal Field Coupled Capacitor [400], with terminals IN/RET [401/402], and OUT/RET [403/404], and with capacitor-pair cross-connect [top layer 431 cross-connecting terminals IN/OUT 401/403, bottom layer 432 cross-connecting RET/RET 402/404], and including vias arranged in split landing pads [capacitor C1 including vias 411/412/413/414, capacitor C2 including vias 421/422/423/424].

FIG. 4 illustrates an example two-layer PCB construction for an example four-terminal Field Coupled Capacitor 400, with (Port 1) terminals IN/RET 401/402, and (Port 2) terminals OUT/RET 403/404.

IN/OUT terminals 401/403 are cross-connected through top layer 431. The RET terminals 402/404 are cross-connected through bottom layer 432. The cross-connects assigned to the top/bottom layers is a design choice.

Vias (end cap) are arranged in split landing pads. Capacitor C1 includes vias 411/412/413/414. Capacitor C2 includes vias 421/422/423/424.

Referring also to FIG. 3, the spatial proximity of the capacitors C1/C1 affects magnetic field coupling of the ESL inductances. Increasing ESL coupling reduces ESL impedance (i.e., the shorted transformer effect). In addition, cross-coupling on multiple layers decreases DC resistance.

Figure 5A:
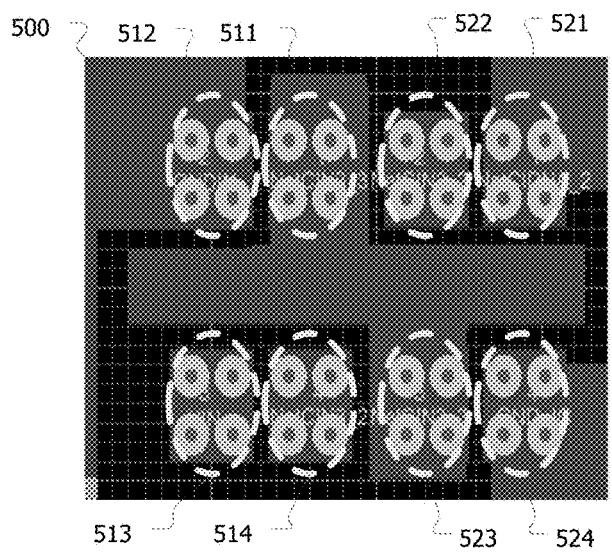
FIGS. 5A-5D illustrating an example four-layer PCB construction for an example Field Coupled Capacitor [500]: top layer [FIG. 5A], mid-layer 1 [FIG. 5B], mid-layer 2 [FIG. 5C], bottom layer [FIG. 5D], with FCC cross-connect
Figure 5D:
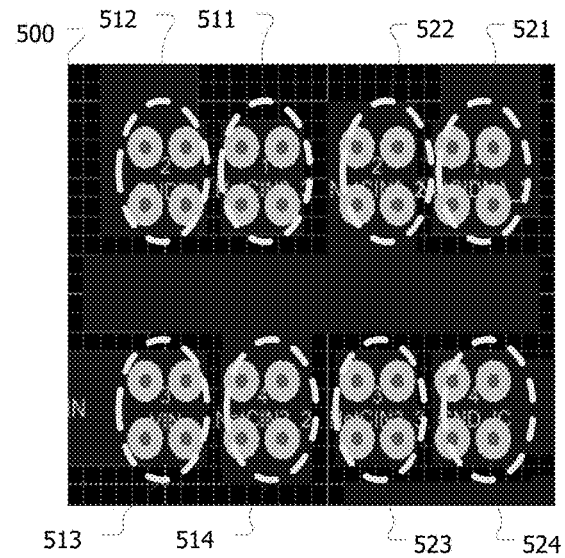
Figure 5B:
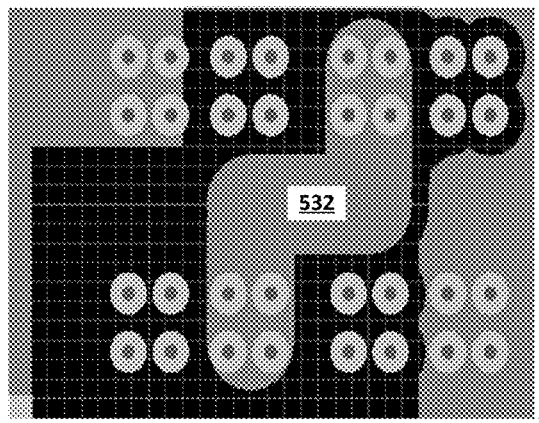
Figure 5C:
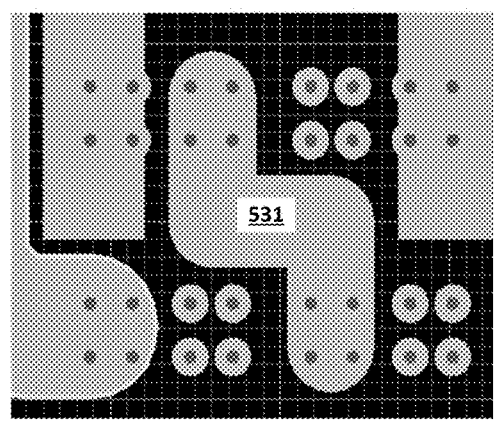

FIGS. 5A-5D illustrates an example Field Coupled Capacitor 500, implemented as a four-layer PCB construction to optimize routing flexibility. FIG. 5A illustrates an example top layer, FIG. 5B illustrates an example mid-layer 1, FIG. 5C illustrates an example mid-layer 2, and FIG. 5D illustrates an example bottom layer.

FCC cross-connect uses the mid-layers 531/532. The IN/OUT terminals are cross-connected through mid-layer 2 531, and the RET terminals are cross-connected through the mid-layer 1 532.

Referring to FIGS. 5A/5D for the top/bottom layers, vias are arranged in split landing pads. The top layer FIG. 5A includes vias 511/512/513/514. The bottom layer FIG. 5B includes vias 521/522/523/524.

FIG. 6 illustrates a portion of an example PCBA (printed circuit board assembly) for an example SMPS (switched mode power supply), labeled SMPS PCBA. An SMPS regulator includes an SMPS power converter IC (such as a buck converter) and an (energy storage) inductor L.

SMPS regulator includes input and output bypass FCC filter sections 600A and 600B. Input bypass FCC 600A includes an FCC double-set filter section 600AA, 600AB. Output bypass FCC 600B includes an FCC double-set filter section 600BA, 600BB. From above, input-side bypass FCC 600A can be used to reduce conducted differential emissions, eliminating the need for additional input filtering, or enabling a smaller and lower cost design, and output-side bypass FCC 600B can be used to reduce high frequency output ripple to reduce noise in the power distribution network, for example, improving jitter performance of an oscillator running on the power supply rail.

FIGS. 7A/7B illustrate an example monolithic implementation for an integrated Field Coupled Capacitor structure (such as ceramic). FIG. 7A illustrates example top and bottom layers 700top and 700bot. FIG. 7B illustrates respective patterns for odd/even mid-layers 700odd and 700evn. The top/bottom layers 700top/700bot include FCC cross-connect 732/731.

Use of a monolithic FCC structure can simplify PCB layout, and eliminate the required vias on the PCB pads. In addition, for a custom monolithic FCC structure, length/width/height ratios can be optimized, such as for SMPS ICs/designs. For example, longer and taller capacitors can provide a better performance match by increasing coupling and lowering the cut-in frequency.

The Disclosure provided by this Description and the Figures sets forth example embodiments and applications illustrating aspects and features of the invention, and does not limit the scope of the invention, which is defined by the claims. Known circuits, connections, functions and operations are not described in detail to avoid obscuring the principles and features of the invention. These example embodiments and applications, including example design considerations, can be used by ordinarily skilled artisans as a basis for modifications, substitutions and alternatives to construct other embodiments, including adaptations for other applications.

The invention claimed is:

1. A device, comprising:
a first printed circuit board (PCB) having a first via along a first row of a first column, a second via along a second row of a second column, and a first conductive trace connecting the first via and the second via, in which the first via is adapted to be coupled to a power converter output, and the second via is adapted to be coupled to a load;
a second PCB having a third via along a second row of the first column, a fourth via along a first row of the second column, and a second conductive trace connecting the third via and the fourth via;
a first capacitor coupled between the first via and the third via; and
a second capacitor coupled between the fourth via and the second via.

2. The device of claim 1, wherein:
the first conductive trace extends diagonally between the first row of the first column and the second row of the second column; and the second conductive trace extends diagonally between the second row of the first column and the first row of the second column.

3. The device of claim 1, wherein the fourth via is adapted to be coupled to the load and configured to receive a return signal from the load, and the second via is adapted to be coupled to the power converter and configured to transmit the return signal to the power converter.

4. The device of claim 1, wherein:
the first PCB includes a top PCB;
the second PCB includes a bottom PCB;
the first capacitor includes a first top plate and a first bottom plate; and
the second capacitor includes a second top plate and a second bottom plate.

5. The device of claim 1, wherein:
the first row of the first column aligns with the first row of the second column;
the second row of the first column aligns with the second row of the second column; and
the first column is parallel to the second column.

6. The device of claim 1, wherein:
the first conductive trace extends perpendicular to and between the first row of the first column and the second row of the second column; and
the second conductive trace extends perpendicular to and between the second row of the first column and the first row of the second column.

7. The device of claim 1, wherein:
the first conductive trace extends parallel to and between the first row of the first column and the second row of the second column; and
the second conductive trace extends parallel to and between the second row of the first column and the first row of the second column.

8. A power supply system comprising:
a first port having a first voltage supply terminal and a first return signal terminal;
a second port having a second voltage supply terminal and a second return signal terminal;
a first printed circuit board (PCB) having a first via coupled to the first voltage supply terminal and positioned along a first row of a first column, a second via coupled to the second voltage supply terminal and positioned along a second row of a second column, and a first conductive trace connecting the first via and the second via;

a second PCB having a third via coupled to the first return signal terminal and positioned along a second row of the first column, a fourth via coupled to the second return signal terminal and positioned along a first row of the second column, and a second conductive trace connecting the third via and the fourth via;

a first capacitor coupled between the first via and the third via; and a second capacitor coupled between the fourth via and the second via.

9. The power supply system of claim 8, wherein the first voltage supply terminal is adapted to be coupled to a power converter, and the second voltage supply terminal is adapted to be coupled to a power load.

10. The power supply system of claim 8, wherein the second return signal terminal is adapted to be coupled to a power load and configured to receive a return signal from the power load, and the first return signal terminal is adapted to be coupled to a power converter and configured to transmit the return signal to the power converter.

11. The power supply system of claim 8, wherein:
the first PCB includes a top PCB;
the second PCB includes a bottom PCB;
the first capacitor includes a first top plate and a first bottom plate; and
the second capacitor includes a second top plate and a second bottom plate.

12. The power supply system of claim 8, wherein:
the first row of the first column aligns with the first row of the second column;
the second row of the first column aligns with the second row of the second column; and
the first column is parallel to the second column.

13. The power supply system of claim 8, wherein:
the first conductive trace extends diagonally between the first row of the first column and the second row of the second column; and
the second conductive trace extends diagonally between the second row of the first column and the first row of the second column.

14. The power supply system of claim 8, wherein:
the first conductive trace extends perpendicular to and between the first row of the first column and the second row of the second column; and
the second conductive trace extends perpendicular to and between the second row of the first column and the first row of the second column.

15. The power supply system of claim 8, wherein:
the first conductive trace extends parallel to and between the first row of the first column and the second row of the second column; and
the second conductive trace extends parallel to and between the second row of the first column and the first row of the second column.

\* \* \* \* \*